United States Patent
Ui et al.

[11] Patent Number: 6,164,295
[45] Date of Patent: Dec. 26, 2000

[54] CVD APPARATUS WITH HIGH THROUGHPUT AND CLEANING METHOD THEREFOR

[75] Inventors: Akio Ui, Tokyo; Naruhiko Kaji; Hideshi Miyajima, both of Yokohama; Nobuo Hayasaka, Yokosuka, all of Japan

[73] Assignee: Kabushiki Kaisha Toshiba, Kawasaki, Japan

[21] Appl. No.: 08/848,264

[22] Filed: Apr. 29, 1997

[30] Foreign Application Priority Data

May 1, 1996 [JP] Japan ................................. 8-110769
Apr. 21, 1997 [JP] Japan ................................. 9-103211

[51] Int. Cl.$^7$ ................................................. H01L 21/302
[52] U.S. Cl. ............................... 134/1.1; 216/59; 216/60; 216/80
[58] Field of Search ........................... 156/345; 134/1.1; 216/59, 60, 80; 118/723 R, 724, 715

[56] References Cited

U.S. PATENT DOCUMENTS

| | | | |
|---|---|---|---|
| 5,016,663 | 5/1991 | Mase et al. ................................. | 134/1 |
| 5,041,311 | 8/1991 | Tsukume et al. ..................... | 427/255.3 |
| 5,584,963 | 12/1996 | Takahashi ............................. | 156/646.1 |
| 5,609,721 | 3/1997 | Tsukume et al. ..................... | 156/646.1 |
| 5,620,526 | 4/1997 | Watatani et al. ......................... | 134/1.1 |
| 5,647,953 | 7/1997 | Williams et al. ..................... | 156/643.1 |
| 5,712,702 | 1/1998 | McGahay et al. ..................... | 356/311 |
| 5,824,375 | 10/1998 | Gupta ..................................... | 427/569 |
| 5,861,065 | 1/1999 | Johnson ................................. | 134/22.1 |

FOREIGN PATENT DOCUMENTS 9-045623 8/1993 Japan .
5-214339 2/1997 Japan .

OTHER PUBLICATIONS

Onishi et al.; "A Mechanism of Particle Generation and a Method to Suppress Particles in Vapor HF/H$_2$O System" Abstract of the 22nd (1990 International) Conference of Solid State Devices and Materials, Sendai, 1990, pp. 1127–1130.

*Primary Examiner*—Gregory Mills
*Assistant Examiner*—George Goudreau
*Attorney, Agent, or Firm*—Finnegan, Henderson, Farabow & Garrett, Dunner, & L.L.P.

[57] ABSTRACT

There is provided a CVD apparatus and a cleaning method which can precisely perform cleaning at a high speed, in order to increase the throughput of a CVD apparatus. A film formation gas (e.g., SiH$_4$ and O$_2$ gases) is introduced from a source gas supply pipe into a chamber to form a silicon oxide film (SiO$_2$) on a wafer placed on a susceptor by using a plasma or the like. A thin film (SiO$_2$) mainly consisting of silicon and oxygen, an imperfect oxide film of silicon, or the like also attaches to a wall surface and the respective surfaces of a window plate, a vacuum seal portion, the susceptor, an electrode, an insulator, an exhaust pipe, and the like in the chamber. An HF-based gas supply system for a cleaning etching gas is arranged to clean the interior of the chamber of the CVD apparatus. Particularly, a film formed with a source gas of Si$_x$H$_{2x+2}$ (x=1, 2, 3) and O$_2$ is more perfect than an imperfect oxide film (e.g., TEOS) formed with an organic silicon source gas, so that bonding is strong, and the etching rate decreases in plasma cleaning and the like. Cleaning with the HF gas according to this invention is very effective.

13 Claims, 8 Drawing Sheets

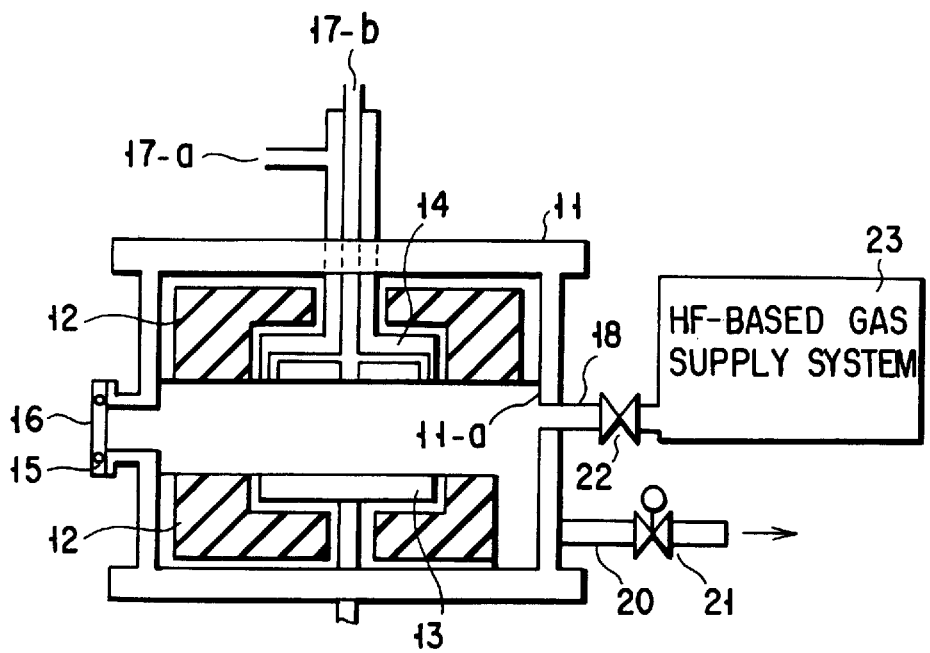
F I G. 1
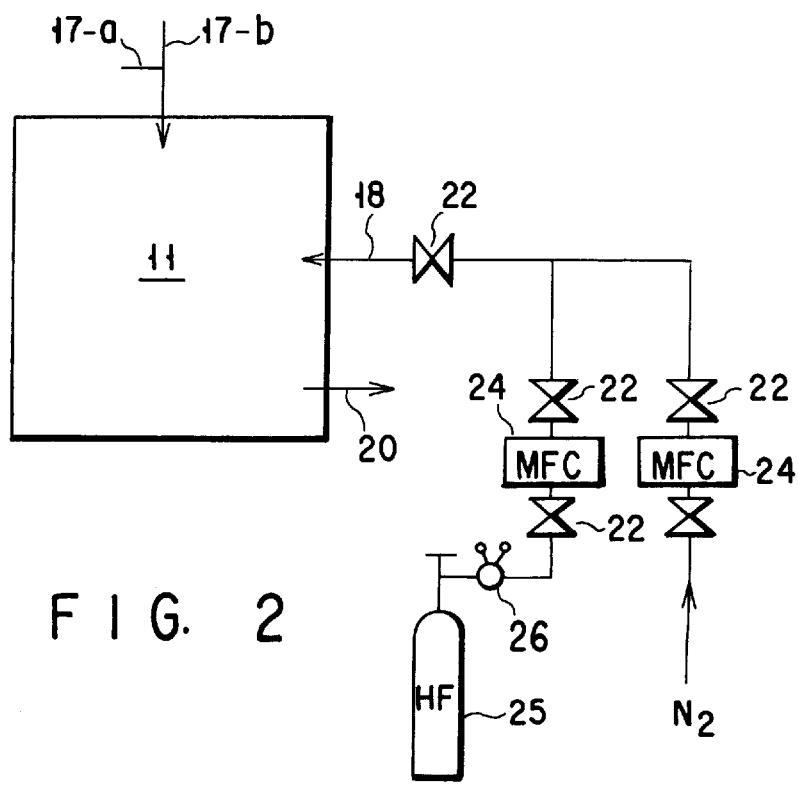
F I G. 2

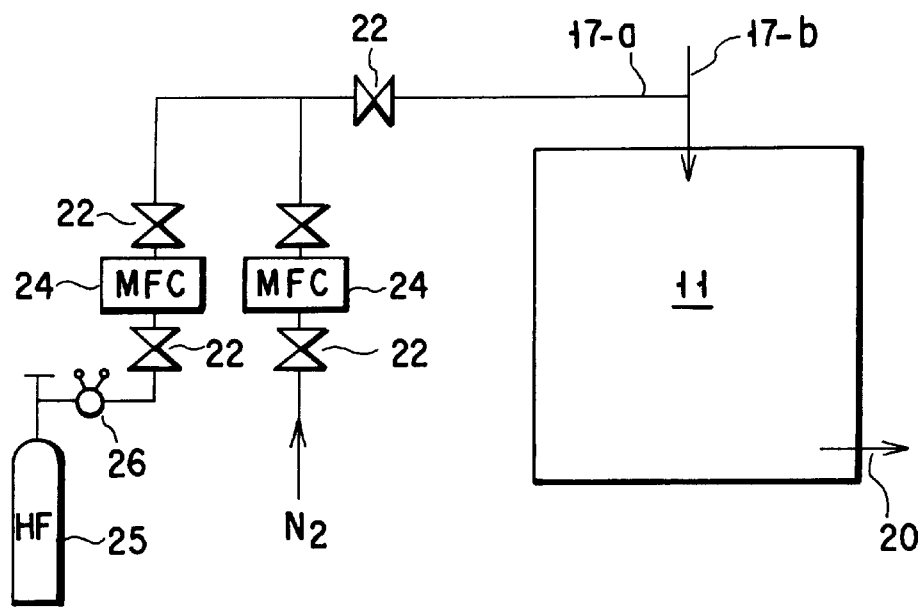
F I G. 3
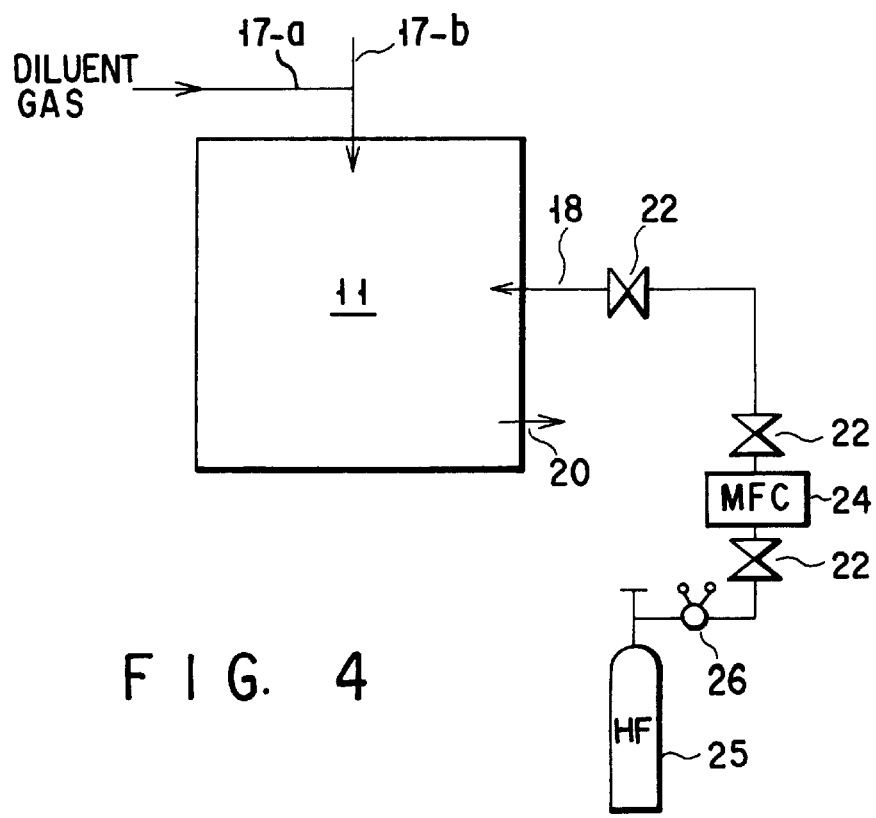
F I G. 4

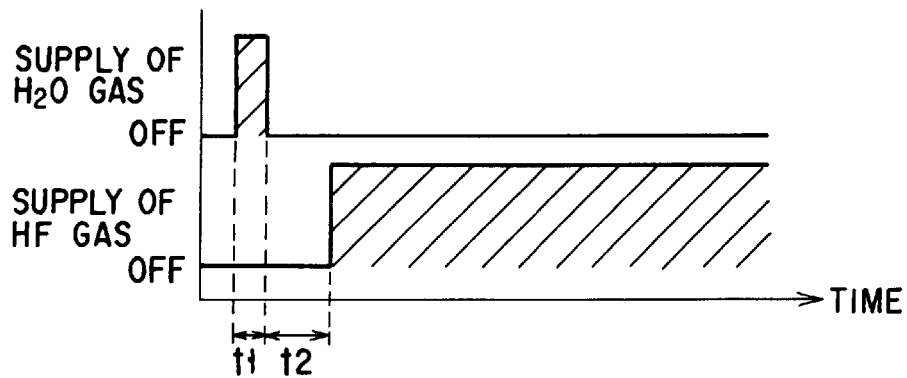
F I G. 11
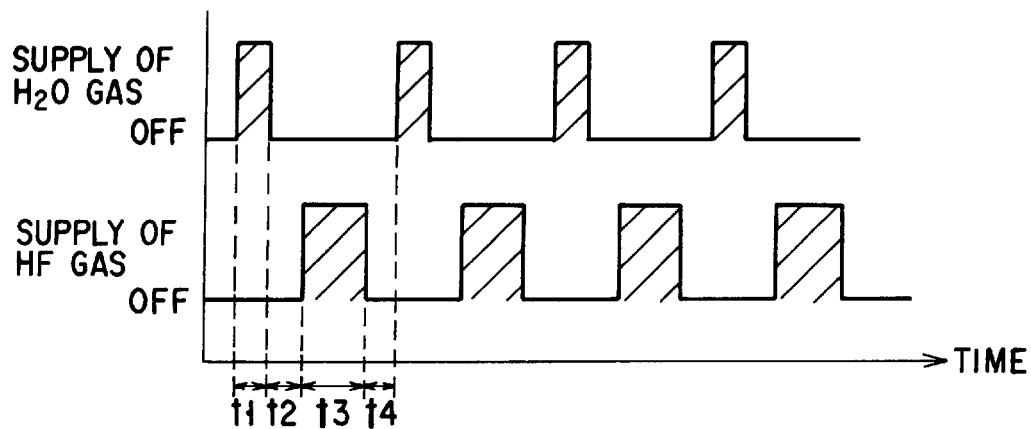
F I G. 12
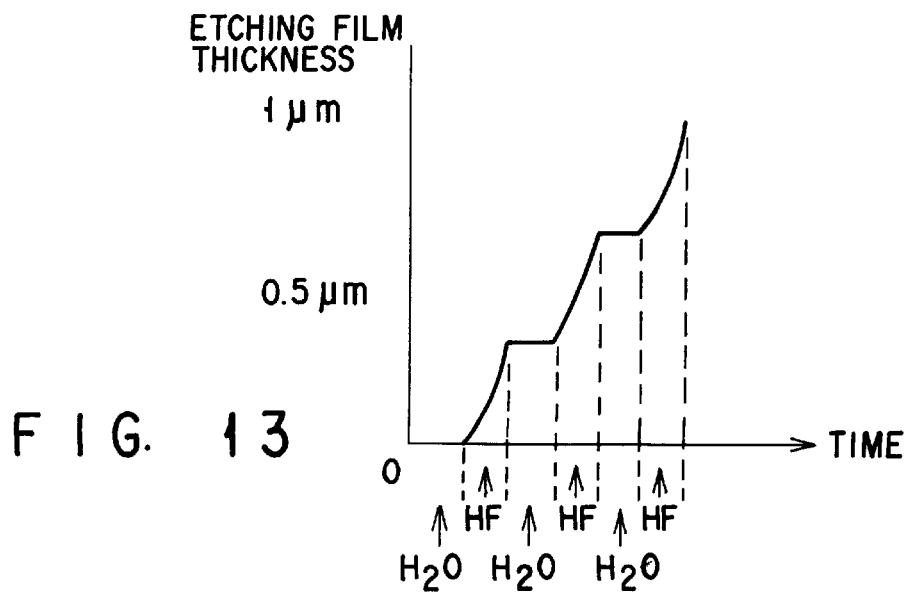
F I G. 13

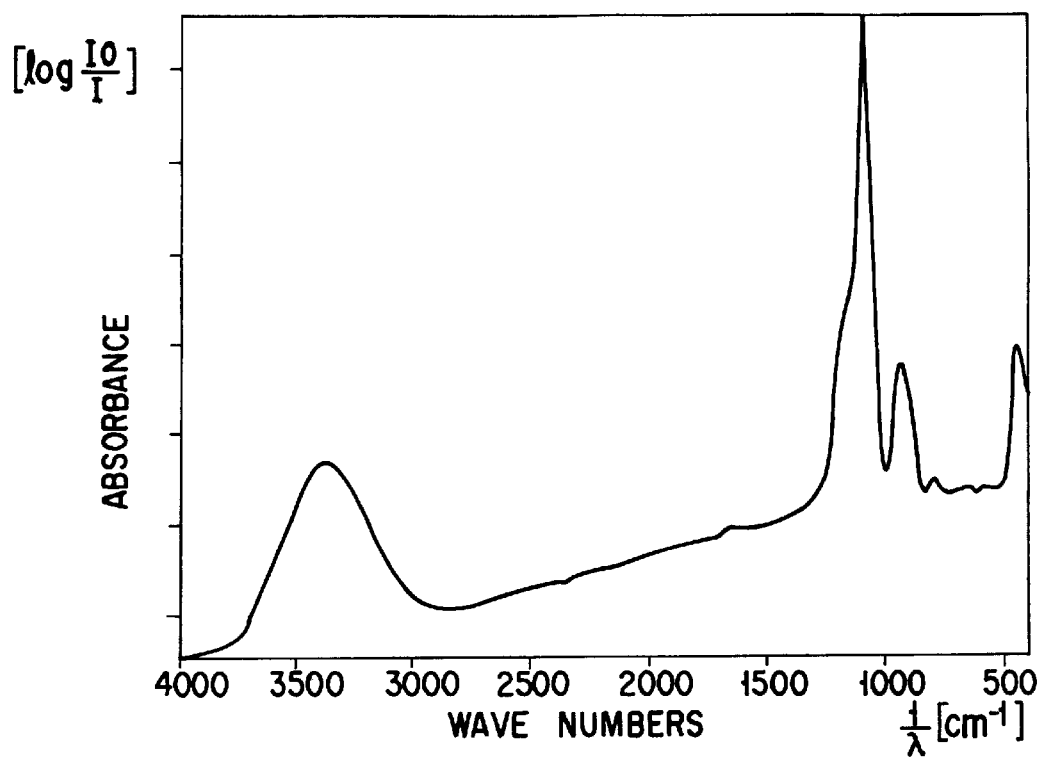
F I G. 17A
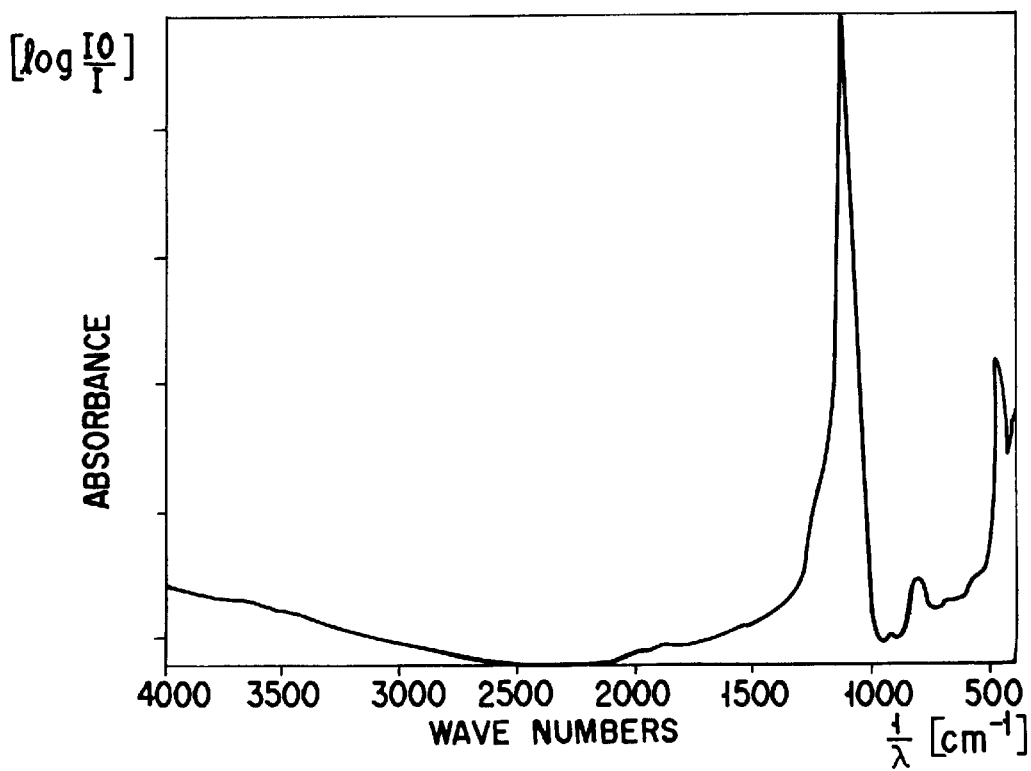
F I G. 17B

CVD APPARATUS WITH HIGH THROUGHPUT AND CLEANING METHOD THEREFOR

BACKGROUND OF THE INVENTION

The present invention relates to a semiconductor manufacturing apparatus and, more particularly, to a CVD apparatus used to grow a silicon oxide film, and a method of cleaning the interior of the CVD apparatus.

CVD (Chemical Vapor Deposition) techniques include thermal CVD, plasma CVD, and photo assisted CVD techniques. A CVD apparatus is one of semiconductor manufacturing apparatuses for growing, on a wafer, a thin $SiO_2$ film and the like required to fabricate a semiconductor element. In the CVD apparatus, as the thin $SiO_2$ film is growing on the wafer, a perfect or imperfect oxide film mainly consisting of Si and O attaches to and is deposited on the inner wall surface of a reaction chamber (to be referred to as a chamber hereinafter), an insulator surface, a susceptor or electrode portion, a vacuum seal portion, a window plate, and the like. With increases in thicknesses, these films peel off to attach as particles to the wafer, resulting in a malfunction of the semiconductor element.

For this reason, the interior of the chamber is cleaned at a predetermined period, e.g., when an unnecessary film like the one described above is deposited to several $\mu$m in the chamber. This cleaning step has conventionally been performed in any one of the following three ways.

(a) The chamber is disassembled and washed. That is, the disassembled chamber is dipped in a processing solution such as aqua regia for a predetermined period of time.

(b) Plasma cleaning using $CF_4$, $C_2F_6$, or $NF_3$ (c) Plasmaless cleaning using $ClF_3$ or $F_2$ Since processing (a) is the same as overhaul processing, it requires a long-time work, decreasing the availability of the CVD apparatus. Processing (b), which is a method of cleaning an unnecessary $SiO_2$ film in the chamber without disassembling the chamber, has a low cleaning rate. The cleaning rate means the etching rate of $SiO_2$ and is about 100 to 300 nm/min, so that the throughput (manufacturing efficiency) of the CVD apparatus lowers.

Since the cleaning (etching) effect of plasma cleaning (b) is low out of the plasma region, the cleaning rate decreases on the inner chamber wall and the insulator surface corresponding to the peripheral region of the plasma. Further, an O-ring (vacuum seal portion coupled to the window plate) in and near the plasma may be undesirably corroded to generate particles.

Plasma cleaning (c) has fewer limitations on cleaning portions than plasma cleaning (b), but its cleaning rate is as low as 100 nm/min or lower. In addition, the O-ring and the like are corroded to generate particles.

A thermal oxide $SiO_2$ film, and an $SiO_2$ film formed by CVD at a reduced or atmospheric pressure using a source gas of silane, tetraethoxysilane (TEOS), or the like are mainly used to manufacture a semiconductor device. Particularly, the $SiO_2$ film formed by plasma CVD is used to insulate aluminum (Al) interconnections because this film is formed at a low temperature of about 400° C.

In recent years, along with a higher integration and higher speed of semiconductor elements, the presence of contaminants contained in the $SiO_2$ film and particles poses serious problems due to the following reasons. When the $SiO_2$ film is formed on the semiconductor substrate using the plasma, stainless steel and aluminum members as constituent elements of the chamber become a metal contamination source and are doped in the $SiO_2$ film on the semiconductor substrate after the interior of the chamber is exposed to the plasma, or the $SiO_2$ film deposited on the inner chamber wall and the like peels off.

A current measure is a method of forming an $SiO_2$ film in advance as a protection film on the inner chamber wall (pre-coating step) before forming an $SiO_2$ film on a semiconductor substrate, and then loading the semiconductor substrate into the chamber.

More specifically, the semiconductor substrate is loaded into the chamber after the pre-coating step, and a desired thin film is formed on the semiconductor substrate. Thereafter, the semiconductor substrate is unloaded from the chamber. Alternatively, loading, thin film formation, and unloading of a plurality of number of semiconductor substrates are repeatedly executed after the pre-coating step. In this case, it should be noted that the film deposited in the chamber causes generation of particles, as described above.

Plasma cleaning is generally performed in the plasma CVD apparatus using $CF_4$ or the like for a long period of time. As described above, the step of pre-coating the inner chamber wall and the like with an $SiO_2$ film about several ten nm to 1 $\mu$m thick is performed prior to the step of growing a film on an actual wafer. This step is performed to prevent metal contamination of the $SiO_2$ film on the wafer by the stainless steel and aluminum members in the chamber.

(1) Cleaning
(2) Pre-coating
(3) Film formation on the wafer (actual manufacturing process)

That is, to operate the CVD apparatus while decreasing particles as much as possible, as described above, the steps (1), (2), and (3) must be performed in this order, though not every operation.

In the plasma cleaning method, however, the protection film (pre-coated film) formed in advance in the pre-coating step is also removed when the film deposited in the chamber is removed. For this reason, this plasma cleaning method has the following problems (a) and (b).

(a) As described above, the cleaning rate changes in and out of the plasma region. At a portion where the cleaning rate is high, the inner chamber wall is exposed early and damaged by the plasma. The damage in the CVD apparatus may become a new cause of generation of particles. Further, consumables inside the apparatus must be frequently exchanged, resulting in a very high cost.

(b) To simultaneously remove the pre-coated film on the inner chamber wall leads to a long cleaning time. In addition, since the protection film must be formed again in the pre-coating step, the total processing time is prolonged due to the time required to perform the pre-coating step.

Considering an increase in throughput of the CVD apparatus and a reduction in manufacturing cost, attention is given to the time associated with cleaning. To operate the CVD apparatus while decreasing particles as much as possible, as described above, (1) cleaning, (2) pre-coating, and (3) film formation on the wafer (actual manufacturing process) must be performed in this order, though not every operation. That is, since the pre-coating step is performed in addition to a long cleaning time, the throughput of the whole CVD apparatus decreases. Further, consumables inside the apparatus must be frequently exchanged due to a long cleaning time, resulting in a high manufacturing cost. Therefore, various measures must be adopted for cleaning.

BRIEF SUMMARY OF THE INVENTION

A deposit consisting of organic alkoxysilane (TEOS and the like) in the CVD system contains carbon in addition to Si and O, and is an imperfect decomposition product. The etching rate of this deposit is higher than that of a deposit consisting of a silicon hydride compound ($Si_xH_{2x+2}$) in the CVD system. For this reason, the above problems are more serious in cleaning of the CVD system using the silicon hydride compound ($Si_xH_{2x+2}$) as a source.

The present invention has been made in consideration of the above situations, and has the following objects.

(1) There is provided a method of cleaning a CVD apparatus at a high speed.

(2) There is provided a method of selectively cleaning only a desired portion while suppressing corrosion (etching) of the interior of the CVD apparatus and preventing generation of particles.

(3) There is provided a method of controlling the cleaning time and a cleaning portion in cleaning the CVD apparatus, and eliminating the pre-coating step in the cleaned chamber.

(4) There is provided a method of generating a cleaning gas to be actually used for cleaning inside the CVD apparatus in cleaning the CVD apparatus, and cleaning the CVD apparatus with the generated gas.

(5) There is provided a semiconductor manufacturing apparatus cleaning method which realizes a low manufacturing cost and a short processing time without generating any particle by selectively removing only a film deposited on a pre-coated film formed in the pre-coating step in cleaning the CVD apparatus.

(6) There is provided a CVD apparatus which realizes the above cleaning methods (1) to (5).

The objects of the present invention are achieved by the following arrangements.

As the first representative feature of a CVD apparatus of the present invention, there is provided a CVD apparatus for growing a silicon oxide film, comprising means for introducing HF gas into the CVD apparatus to clean a deposit mainly consisting of Si and O, which attaches to an interior of the apparatus.

As the second representative feature of the present invention, there is provided a CVD apparatus for growing a silicon oxide film, comprising first introduction means for introducing HF gas for cleaning into the CVD apparatus, second introduction means for introducing an inert gas for diluting the HF gas into the CVD apparatus, and means for controlling a concentration of the HF gas within a predetermined range so as not to etch an internal member of the CVD apparatus except for a cleaning target.

As the third representative feature of the present invention, there is provided a CVD apparatus for growing a silicon oxide film, comprising first introduction means for introducing at least one kind of gas of $CF_4$, $C_2F_6$, $NF_3$, and $F_2$ into the CVD apparatus, second introduction means for introducing at least one kind of gas of $H_2$, $H_2O$, and $H_2O_2$ into the CVD apparatus, and means for generating a plasma using the gases from the first and second introduction means to perform plasma cleaning with respect to an interior of the CVD apparatus.

As the fourth representative feature of the present invention, there is provided a CVD apparatus for depositing an insulating film mainly consisting of silicon and oxygen on a semiconductor substrate, comprising control means for setting a large etching selectivity between a protection film formed on an inner wall surface of the CVD apparatus before loading the semiconductor substrate into the CVD apparatus, and a deposit formed on the protection film afterward, and cleaning means for selectively removing only the deposit as a cleaning target, and leaving the protection film except for the cleaning target.

As the first representative feature of a CVD apparatus cleaning method according to the present invention, there is provided a cleaning method for a CVD apparatus for growing a silicon oxide film, comprising the step of introducing HF gas into the CVD apparatus to clean a deposit mainly consisting of Si and O, which attaches to an interior of the apparatus.

As the second representative feature of a CVD apparatus cleaning method according to the present invention, there is provided a cleaning method for a CVD apparatus for growing a silicon oxide film, comprising the step of introducing HF gas for cleaning into the CVD apparatus after the HF gas is diluted with an inert gas, and controlling a concentration of the HF gas within a predetermined range so as not to etch an internal member of the CVD apparatus except for a cleaning target.

As the third representative feature of a CVD apparatus cleaning method according to the present invention, there is provided a cleaning method for a plasma CVD apparatus for growing a silicon oxide film, comprising the step of performing plasma cleaning with at least one kind of gas of $CF_4$, $C_2F_6$, $NF_3$, and $F_2$ and at least one kind of gas of $H_2$, $H_2O$, and $H_2O_2$.

As the fourth representative feature of a CVD apparatus cleaning method according to the present invention, there is provided a cleaning method for a CVD apparatus for depositing an insulating film mainly consisting of silicon and oxygen on a semiconductor substrate, comprising the step of forming in advance a protection film which allows an etching selectivity with a deposit to be formed on the protection film afterward in the apparatus before loading the semiconductor substrate into the apparatus, the step of forming the insulating film after loading the semiconductor substrate into the apparatus, and the step of cleaning an interior of the apparatus after unloading the semiconductor substrate, wherein the cleaning step has the step of selectively removing only the deposit which attaches to the protection film in forming the insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing main part of the system arrangement of a plasma CVD apparatus according to the first embodiment of the present invention;

FIG. 2 is a diagram showing an example of the gas system of the CVD apparatus according to the present invention as the second embodiment;

FIG. 3 is a diagram showing an example of the gas system of the CVD apparatus according to the present invention as the third embodiment;

FIG. 4 is a diagram showing an example of the gas system of the CVD apparatus according to the present invention as the fourth embodiment;

FIG. 11 is a timing chart showing the supply timings of HF gas and $H_2O$ gas according to the 12th embodiment of the present invention;

FIG. 12 is a timing chart showing the supply timings of HF gas and $H_2O$ gas according to the 13th embodiment of the present invention;

FIG. 13 is a graph showing the etching state upon cleaning by alternately supplying HF gas and $H_2O$ gas according to the 13th embodiment of the present invention;

FIGS. 17A and 17B are graphs of infrared absorption spectra, respectively, showing the inspection result of the difference in quality between a deposition film on a pre-coated film and the pre-coated film on an inner chamber wall on the basis of infrared absorption spectrophotometry (FT-IR method) according to the 16th embodiment.

DETAILED DESCRIPTION OF THE INVENTION

Figure 5:
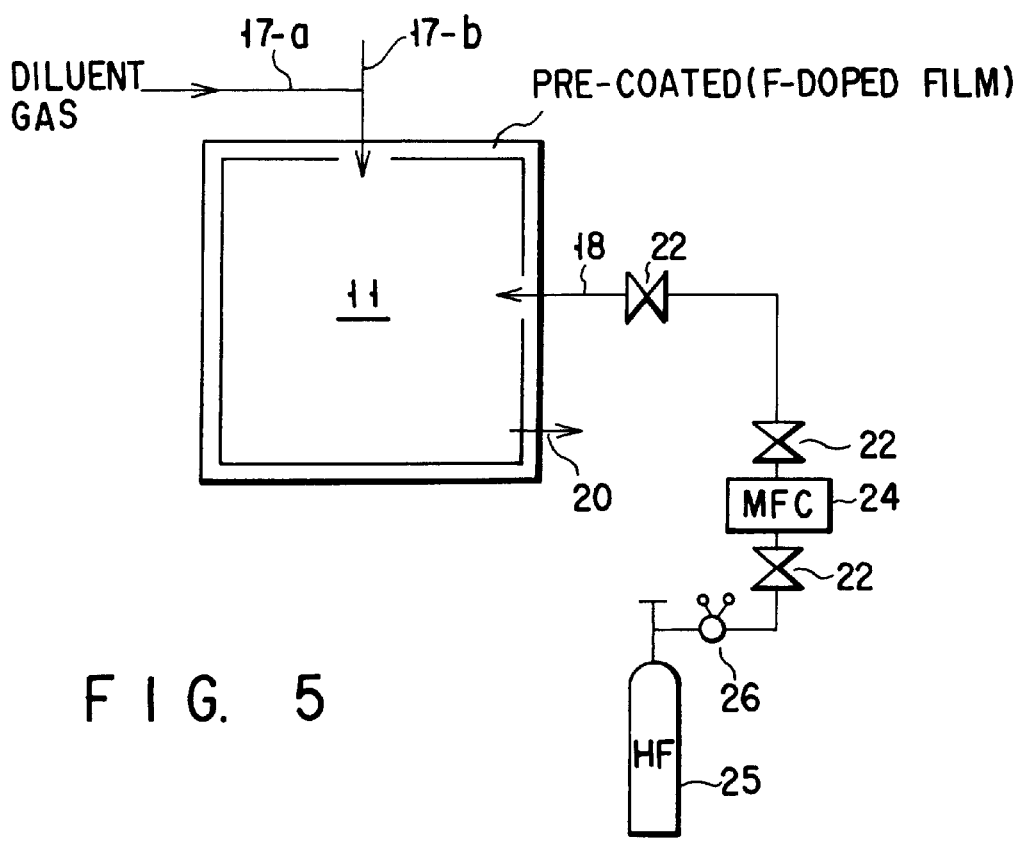
FIG. 5 is a diagram showing an example of the gas system of the CVD apparatus according to the present invention as the sixth embodiment.

The present invention is based on a case wherein a spontaneous oxide film ($SiO_2$) on a wafer is etched using HF gas (reference: Extended Abstracts of the 22nd (1990 International) Conference on Solid State Devices and Materials, Sendai, 1990, pp. 1091–1093). With HF gas, $SiO_2$ can be etched at room temperature and a high rate of about 1 μm/sec while controlling dilution of $N_2$.

One of important features of the present invention is the use of this HF gas for cleaning a CVD apparatus. The HF gas is so corrosive as to greatly corrode silica and stainless steel members, so that measures must be adopted against particle.

FIG. 1 is a sectional view showing main part of the system arrangement of a plasma CVD apparatus according to the first embodiment of the present invention. Reference numeral 11 denotes a reaction chamber of the CVD apparatus; 11-a, an inner wall surface of the chamber; 12, an insulator; 13, a susceptor and electrode (lower electrode); 14, an electrode (upper electrode); 15, a vacuum seal portion (O-ring); 16, a silica window plate; 17-a and 17-b, source gas supply pipes; 18, a cleaning etching gas supply pipe; 20, an exhaust pipe; and 21, e.g., an automatic pressure regulating valve. A supply system 23 for an HF-based gas as a cleaning etching gas is arranged on the upstream side of the gas supply pipe 18 through, e.g., a valve 22. The gas supply pipe 18 is preferably constituted by a corrosion-resistant member (e.g., a ceramic pipe) in consideration of the supply of the HF-based gas.

In FIG. 1, a film formation gas (e.g., $SiH_4$ and $O_2$ gases) is introduced into the chamber 11 through the source gas supply pipe 17-a to form a silicon oxide film ($SiO_2$) on a wafer placed on the susceptor 13 by using a plasma or the like. A thin film ($SiO_2$) mainly consisting of silicon and oxygen, an imperfect oxide film of silicon, or the like also attaches to the inner wall surface 11-a of the chamber 11 and the respective surfaces of the window plate 16, the vacuum seal portion 15, the susceptor 13, the electrode 14, the insulator 12, the exhaust pipe 20, and the like.

A CVD apparatus cleaning method of cleaning these undesirable films according to the present invention will be described below.

In FIG. 1, after the film-formed wafer is unloaded, HF gas is diluted to about 0.1 vol % to 10 vol % with an inert gas (e.g., $N_2$, Ar, Ne, or He), and the dilute HF gas is introduced from the inlet of the gas supply pipe 18 into the chamber 11. The undesirable portions, i.e., the films mainly consisting of Si and O which attach to the inner wall surface 11-a of the chamber 11 and the respective surfaces of the window plate 16, the vacuum seal portion 15, the susceptor 13, the electrode 14, the insulator 12, the exhaust pipe 20, and the like are etched and cleaned by this HF gas at a high rate of about 0.7 μm/sec. That is, the attached undesirable films are gasified on the basis of $SiO_2+4HF \rightarrow SiF_4+2H_2O$, and the gas is exhausted outside the chamber through the exhaust pipe 20.

FIG. 2 is a diagram showing an example of the gas system of the CVD apparatus according to the present invention as the second embodiment. As shown in FIG. 2, after the HF gas is diluted with an inert gas, the diluted HF gas is introduced into the chamber. In FIG. 2, solid lines represent pipes, and arrows represent the supply and exhaust of gases. The chamber 11 in FIG. 1 is represented by a block with source gas supply pipes 17-a and 17-b and an exhaust pipe 20. In this gas system, reference numeral 22 denotes a valve; 24, a mass flow controller; 25, an HF gas supply system; and 26, a flowmeter. An etching gas supply pipe 18 is preferably constituted by a corrosion-resistant member in consideration of the supply of the HF-based gas, and is preferably 20 to 30 cm long from the mixing of the HF and a diluent gas. An inert gas for diluting the HF gas will be referred to as a "diluent gas" hereinafter.

FIG. 3 is a diagram showing an example of the gas system of the CVD apparatus according to the present invention as the third embodiment. The HF gas is introduced through a source gas supply pipe 17-a. In cleaning, an etching gas is introduced instead of a source gas.

FIG. 4 is a diagram showing an example of the gas system of the CVD apparatus according to the present invention as the fourth embodiment. The HF gas is introduced from the inlet of a gas supply pipe 18 into a chamber 11 without diluting it, and a diluent gas is introduced into the chamber 11 from another gas inlet, e.g., the inlet of a source gas supply pipe 17-a. The gas supply pipe 18 is desirably constituted by a corrosion-resistant pipe such as a ceramic pipe because of the supply of the HF gas.

The diluent gas may be $O_2$ gas, $F_2$ gas, $Cl_2$ gas, HCl gas, $CF_4$ gas, $C_2F_6$ gas, $NF_3$ gas, $CO_2$ gas, CO gas, $NO_2$ gas, $N_2O$ gas, or the like unless it does not hinder etching and cleaning.

According to the present invention, particularly a film formed with a source gas of $Si_xH_{2x+2}$ (x=1, 2, 3) and $O_2$ is more perfect than an imperfect oxide film (e.g., TEOS) formed with an organic silicon source gas, so that bonding is strong, and the etching rate decreases in plasma cleaning and the like. Therefore, cleaning with the HF gas according to the present invention is very effective.

In addition, since a nitrogen-doped silicon oxide film (e.g., SiON formed by CVD of $TEOS+O_3+NH_3$ or $SiH_4+O_2+NH_3$) is more strongly bonded, the etching rate further decreases in plasma cleaning and the like. Therefore, cleaning with the HF gas according to the present invention is more effectively performed.

A CVD apparatus cleaning method in consideration of control of the concentration of the HF gas used for cleaning will be described as the fifth embodiment. A silicon oxide film to be etched and cleaned with the HF gas has different etching rates and different etching start HF concentration ranges in accordance with the components of the film, the wet etching rate, the hydrogen content, the density, and the like.

In this case,

C1: the HF concentration at which etching with the HF gas starts with respect to a silica member C2: the HF concentration at which etching with the HF gas starts with respect to a pre-coated film in the chamber C3: the HF concentration at which etching with the HF gas starts with respect to a film mainly consisting of Si and O attached to the pre-coated film in the chamber C4: the HF gas concentration at which stainless steel and aluminum members in the chamber are corroded Under the above conditions, the CVD apparatus can be selectively cleaned without corroding the silica member if the film mainly consisting of Si and O is etched using the HF gas with an HF concentration which satisfies $$C3<x<C1 \quad (1)$$

where x is the concentration of the HF gas in use.

For example, when cleaning was performed at an HF concentration of 1 vol % to 5 vol % (note that $H_2O$ is 1 vol ppm or lower), an unnecessary film mainly consisting of Si and O was etched and removed at a high speed without corroding the silica window plate, the stainless steel member, and the like.

In addition, the unnecessary film mainly consisting of Si and O can be etched and removed without corroding the stainless steel and aluminum members in the chamber if the HF concentration of the HF gas is adjusted to satisfy $$C3<x21 \; C4 \quad (2)$$

Taking the pre-coated film into consideration, it can be controlled to selectively etch the unnecessary film on the pre-coated film without etching the pre-coated film in the chamber by using the HF gas with an HF concentration which satisfies $$C3<x<C2 \quad (3)$$

With this processing, the following pre-coating step can be omitted.

If the pre-coated film is formed at a composition ratio which represents a higher Si content, C3<C2 becomes clear. A partial omission of the pre-coating step can result in a high throughput of the whole CVD apparatus.

FIG. 5 is a diagram showing an example of the gas system of the CVD apparatus according to the present invention as the sixth embodiment. In this embodiment, a pre-coated film is formed in a chamber 11 in the pre-coating step. This pre-coated film is an F (fluorine)-doped silicon oxide film.

When the fluorine-doped silicon oxide film is formed by CVD, the etching rate of this film is much higher than that of a silicon oxide film doped with no fluorine. Accordingly, the above etching start concentration C3 is lower, so that the range of the concentration x in conditions (1), (2), and (3) can be widened, and cleaning can be performed with a high selectivity.

As shown in FIG. 5, an unnecessary film which attaches to the pre-coated film upon an actual manufacturing process is lifted off by pre-coating the interior of the chamber with the F-doped silicon oxide film, and cleaning with the HF gas is performed at a higher speed.

As described above, the fifth embodiment exemplifies the case wherein the pre-coated film in the chamber remains and only the unnecessary film is removed by controlling the selectivity based on the concentration. The sixth embodiment exemplifies the case wherein the unnecessary film is removed together with the lower pre-coated film in cleaning. These embodiments have the following advantages.

That is, the fifth embodiment shows the cleaning method in which the pre-coating step is eliminated to increase the throughput of the CVD apparatus while suppressing generation of particles as much as possible. The sixth embodiment shows the cleaning method in which cleaning is performed at a higher speed by giving priority to the reliability against generation of particles or the like, thereby increasing the throughput of the CVD apparatus.

Note that the HF concentration may be controlled by flowing a diluent gas as a purge gas to only a portion near a portion not to be etched. By controlling the flow rate of the purge gas, the degree of cleaning can be controlled, and cleaning can also be stopped midway. With this operation, partial cleaning can be expected. This is the seventh embodiment.

Figure 6:
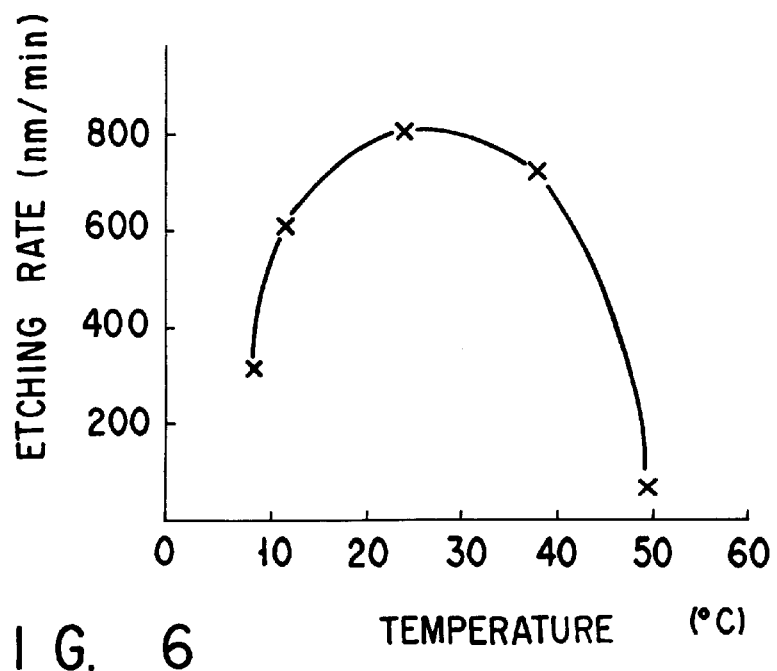
FIG. 6 is a graph showing the relationship between the temperature of HF gas and the etching rate.

A CVD apparatus cleaning method in consideration of the temperature in etching and cleaning will be described as the eighth embodiment. As shown in FIG. 6, the etching rate of $SiO_2$ with the HF gas increases along with an increase in temperature near normal room temperature. If the temperature exceeds room temperature, the etching reaction becomes slow because of less adsorption of the HF gas on the chamber wall surface. At 50° C. or higher, the etching rate abruptly decreases, and no etching is performed substantially.

HF+{surface}→HFabsorb (adsorption)

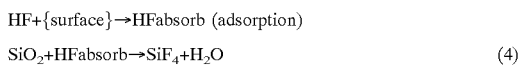

From this fact, only the target cleaning portion can be selectively cleaned by increasing the temperatures (to, e.g., 50° C. or higher) of portions not to be etched with the HF gas, such as stainless steel and aluminum members in the chamber, a silica member, an exhaust pipe, and a susceptor.

Figure 7:
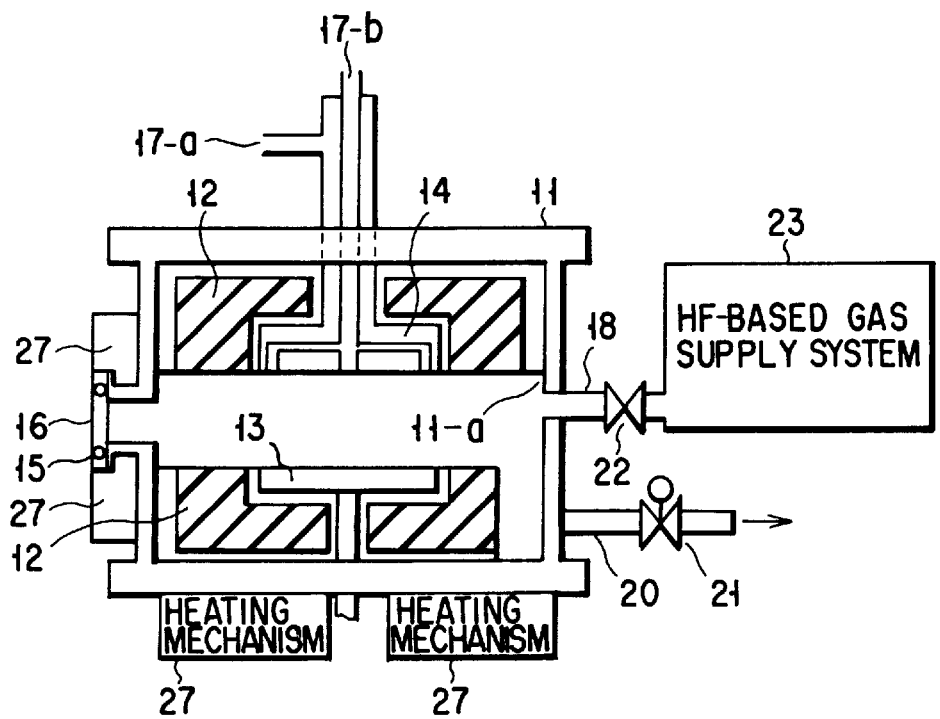
FIG. 7 is a sectional view showing main part of the system arrangement of a plasma CVD apparatus according to the eighth embodiment of the present invention.

FIG. 7 is a sectional view showing main part of the system arrangement of the a plasma CVD apparatus according to the above-described eighth embodiment of the present invention. The CVD apparatus of the eighth embodiment is different from that in FIG. 1 in that it comprises a heating mechanism 27 for partially increasing the temperature.

When a film mainly consisting of Si and O was actually cleaned at a high rate of 1 μm/sec, no corrosion (etching) was found at the aluminum portion of the inner chamber wall heated to 60° C. by a ribbon heater wound on the chamber. The progress of etching can be adjusted by increasing the temperature in the course of cleaning of an unnecessary film attached in CVD, or controlling the temperature to stop etching every etching portion. The heating mechanism 27 may be of a resistance heating scheme or a lamp heating scheme.

A CVD apparatus cleaning method in consideration of the use of plasma cleaning will be described as the ninth embodiment. Plasma cleaning itself has a low cleaning rate, but exhibits a new effect with HF gas cleaning. HF cleaning of a silicon oxide film utilizes an increase in etching rate upon an increase in concentrations of H and F in the film.

Figure 8:
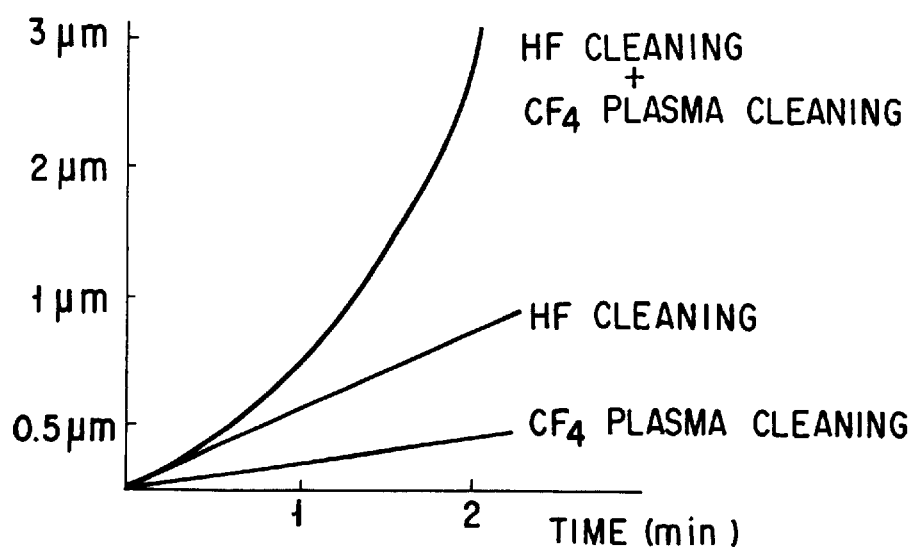
FIG. 8 is a graph showing comparison between etching using both plasma cleaning and HF cleaning and etching using neither plasma cleaning nor HF cleaning.

An unnecessary film attached to the inner chamber wall or the like is changed into a film doped with H and F upon $CF_4$ plasma cleaning or plasma application. The cleaning rate increases synergistically (FIG. 8). Plasma cleaning may be performed at the same time with or before HF cleaning. Plasma cleaning may be performed with the HF gas. Considering the reliability, HF cleaning which may corrode silica, stainless steel, and aluminum members may be performed in the first half, and moderate plasma cleaning may be performed in the second half.

Figure 9:
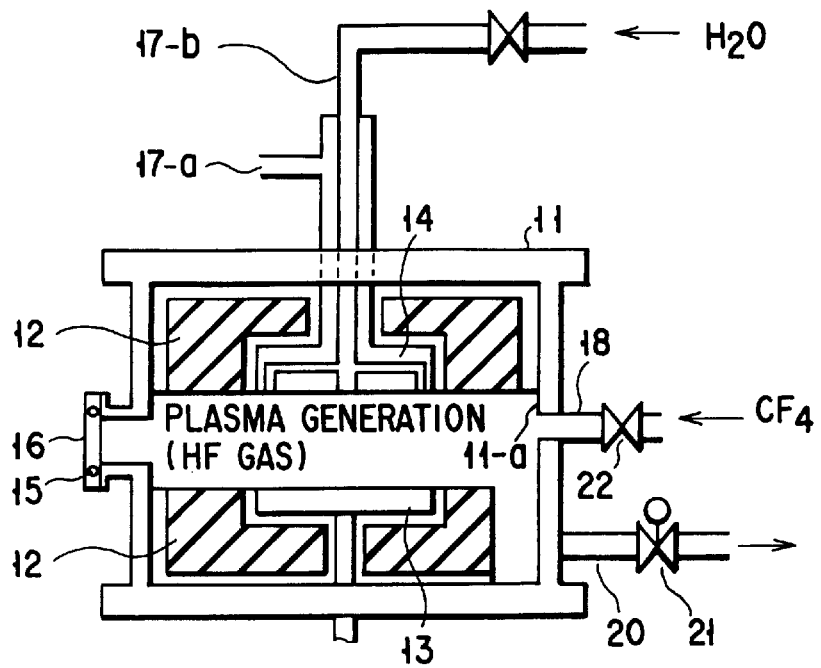
FIG. 9 is a sectional view showing main part of the system arrangement of a plasma CVD apparatus according to the 10th embodiment of the present invention.

FIG. 9 is a sectional view showing main part of the system arrangement of a plasma CVD apparatus according to the 10th embodiment of the present invention. A reaction is caused by a plasma in a chamber in plasma cleaning to generate HF gas, thereby performing HF cleaning. In FIG. 9, $CF_4$ gas and $H_2O$ gas are respectively introduced from gas supply pipes 18 and 17-b into a chamber 11. The same reference numerals denote the same parts as in FIG. 1. With a plasma,

$$CF_4 + H_2O \rightarrow HF + CO_2 \tag{5}$$

According to the above method, no HF gas is introduced from the outside of the chamber, and the inlet pipe is free from any corrosion. Although $CF_4$ and $H_2O$ gases are employed in this embodiment, another combination may be used. For example, at least one kind of gas of $CF_4$, $C_2F_6$, $NF_3$, and $F_2$, and at least one kind of gas of $H_2$, $H_2O$, and $H_2O_2$ are introduced into the chamber to generate a plasma, thereby generating HF gas inside the chamber.

Figure 10:
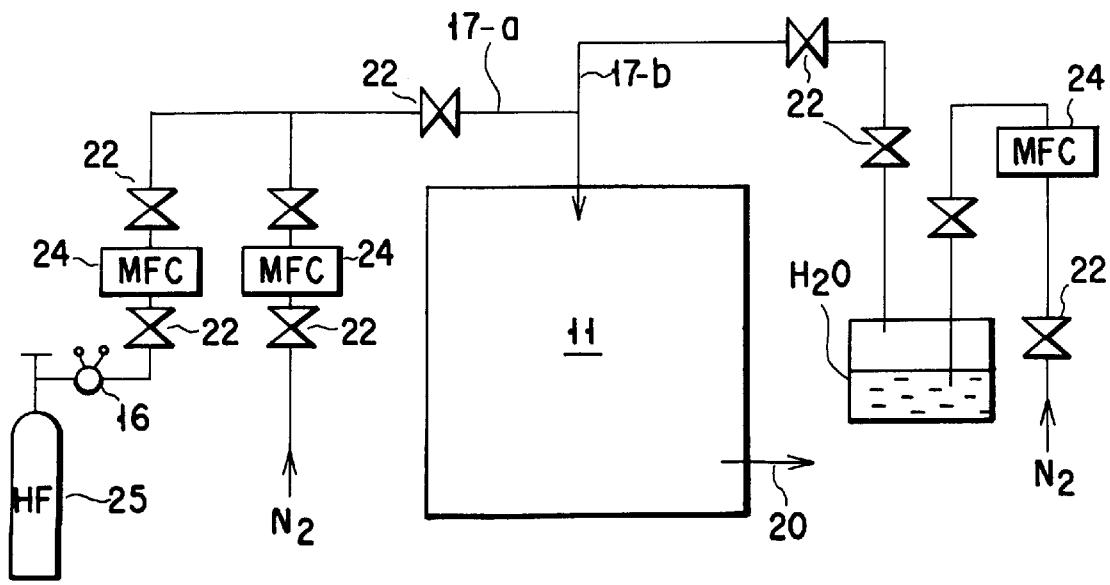
FIG. 10 is a diagram showing an example of the gas system of the CVD apparatus according to the present invention as the 11th embodiment.

FIG. 10 is a diagram showing an example of the gas system of the CVD apparatus according to the present invention as the 11th embodiment. This embodiment is related to cleaning with the HF gas and a CVD apparatus cleaning method in consideration of introduction of $H_2O$. The etching ability of the HF gas is abruptly improved in the presence of $H_2O$. HF gas and, e.g., $N_2$ gas saturated with $H_2O$ vapor are respectively introduced from gas supply pipes 17-a and 17-b into a chamber 11.

The gas saturated with $H_2O$ includes an inert gas such as Ar, He, and Ne, $CO_2$ gas, $O_2$ gas, $NO_2$ gas, and $H_2$ gas, in addition to $N_2$ gas. The $H_2O$ vapor may not be saturated.

The $H_2O$-vapor-containing gas may be introduced from a different supply port into the chamber, as shown in FIG. 10. Alternatively, after the gas is mixed with the HF gas, the resultant gas may be introduced into the chamber. In this case, a corrosion-resistant pipe such as a ceramic pipe may be arranged. A CVD apparatus cleaning method in consideration of etching control in the chamber in the 11th embodiment will be described as the 12th embodiment. By simultaneously introducing the $H_2O$-vapor-containing gas and the HF gas into the chamber, a film mainly consisting of Si and O is etched at a higher rate. However, since the interior becomes highly reactive, a silica window plate and stainless steel and aluminum portions are easily corroded. Also in this embodiment, corrosion in the chamber can be prevented by various etching control operations in the above fifth to eighth embodiments. In particular, control of the $H_2O$ concentration is important.

$$SiO + H_2O \rightarrow SiO\,(H_2O) \tag{6}$$

$$SiO + H_2O \rightarrow Si{-}OH \tag{7}$$

As is apparent from the above formulas, an imperfect or perfect oxide film mainly consisting of Si and O contains $H_2O$ (formula (6)) or is partially changed into a structure having Si—OH bonds (formula (7)) upon exposure into $H_2O$ vapor.

More specifically, the unnecessary film mainly consisting of Si and O is changed into an Si—OH structure or an $H_2O$-containing film upon exposure into $H_2O$ vapor. As a result, the cleaning rate with the HF gas is increased.

As shown in FIG. 11, the $H_2O$-vapor-containing gas is first introduced into the chamber prior to cleaning with the HF gas to change the quality of the unnecessary film mainly consisting of Si and O. After the supply of the $H_2O$ gas is stopped, the HF gas is introduced. With this processing, cleaning is performed at a high speed without corroding the interior of the chamber. In FIG. 11, t1 is the time required to supply the $H_2O$-vapor-containing gas, and t2 is the time required to exhaust $H_2O$ vapor from the chamber and eliminate $H_2O$ adsorbed on the inner chamber wall.

In addition, the interior of the chamber may be heated within the time t2 or purged with an inert gas such as $N_2$ (it is important that the inert gas is a dry gas free from any $H_2O$). With this processing, $H_2O$ attached to the inner chamber wall can be eliminated to completely prevent corrosion in the chamber.

A CVD apparatus cleaning method in consideration of etching control in the chamber in the 11th embodiment will be described as the 13th embodiment. As shown in FIG. 12, the 13th embodiment is an application of the above-described method in FIG. 11 which further takes control of the etching time into consideration. That is, an $H_2O$-vapor-containing gas and an HF-containing gas are alternately supplied. t1 is the time required to supply the $H_2O$-vapor-containing gas, t2 is the time required to exhaust $H_2O$ vapor from the chamber and eliminate $H_2O$ absorbed in the inner chamber wall, t3 is the HF cleaning time, and t4 is the exhaust time of a cleaning gas.

According to the above method, the quality of the surface of an unnecessary film mainly consisting of Si and O which attaches to the inner chamber wall can be changed, and the progress of etching can be controlled by repeatedly performing etching with introduced HF gas and controlling the etching time (FIG. 13). Therefore, cleaning can be performed at a high speed without corroding the interior of the chamber.

In the 12th and 13th embodiments,.to change the quality of the $H_2O$ film is particularly effective for an F (fluorine)-doped silicon oxide film and also for cleaning the CVD apparatus in a process for the F-doped silicon oxide film, as a matter of course.

A CVD apparatus cleaning method in consideration of the cleaning pressure in the chamber in the 11th embodiment will be described as the 14th embodiment. As described above, the etching rate with the HF gas is greatly influenced by the presence of $H_2O$. If cleaning is performed at a pressure higher than the saturated vapor pressure of $H_2O$, $H_2O$ is partially condensed (liquefied) on the susceptor, the inner chamber wall, and the like to corrode the portions. As a measure, etching and cleaning are performed in the chamber at a pressure lower than the saturated vapor pressure of $H_2O$ to prevent partial corrosion and attain cleaning.

Figure 14:
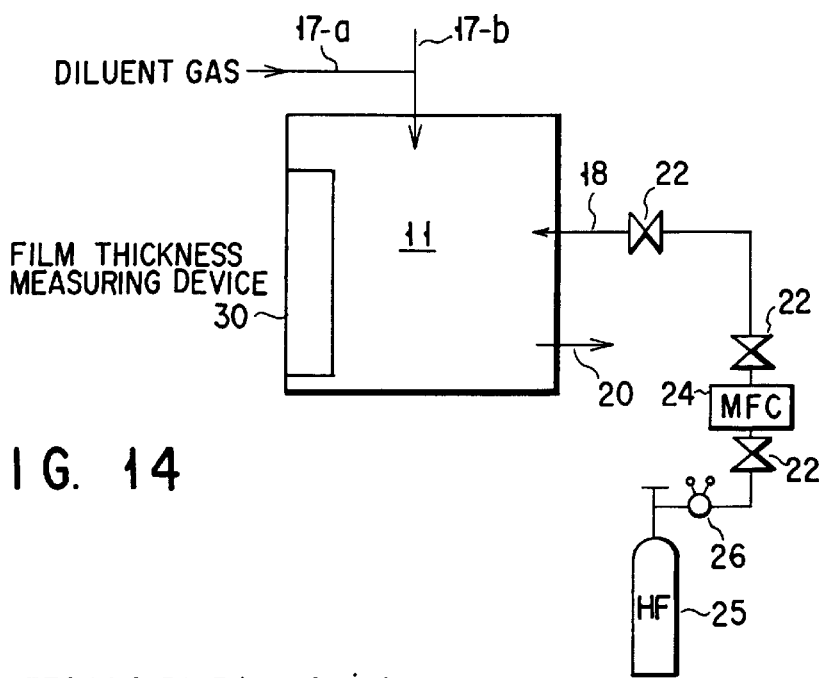
FIG. 14 is a diagram showing an example of the gas system of the CVD apparatus according to the present invention as the 15th embodiment.
Figure 15:
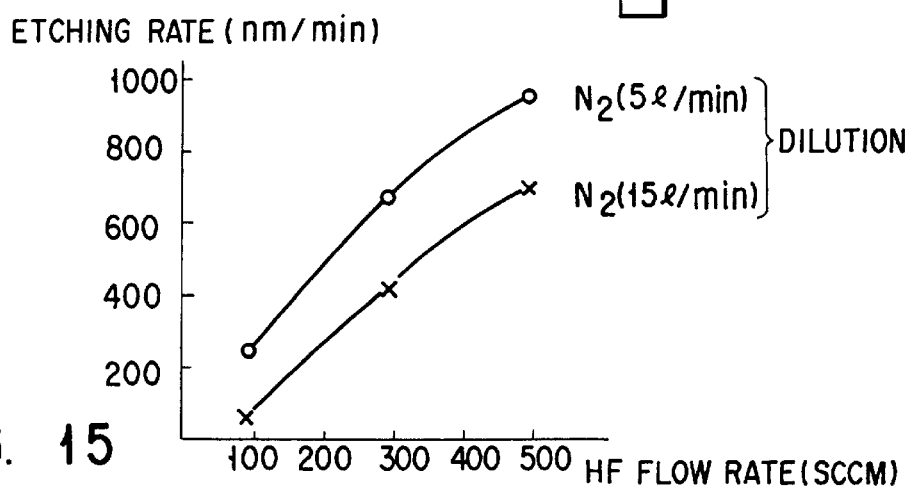
FIG. 15 is a graph showing the etching rate of a spontaneous oxide film by HF gas.

FIG. 14 is a diagram showing an example of the gas system of the CVD apparatus according to the present invention as the 15th embodiment. A chamber 11 comprises a film thickness measuring device 30 serving as a cleaning monitor means. With this arrangement, the cleaning situation can be monitored during cleaning the CVD apparatus.

As the film thickness measuring device 30, a crystal oscillator, an arrangement using an optical method of checking the transmittance and light emission of a gas, and an exposure detector for the inner chamber wall and a pre-coated film may be used. With this arrangement, e.g., cleaning can be reliably stopped at the end of etching to prevent corrosion in the chamber due to over-etching. Also, etching of the pre-coated film can be prevented.

To clean a film (about 3 μm thick) mainly consisting of Si and O, which is deposited on the inner chamber wall of the CVD apparatus, cleaning with the HF gas according to the present invention requires only 6 min which is about half the conventional $CF_4$ plasma cleaning time of about 12 min. Further, the film can be cleaned within about 2 min by performing both cleaning with the HF gas and $CF_4$ plasma cleaning described in the embodiment. In addition, since cleaning is performed while preventing the pre-coated film from etching and the respective portions in the chamber from corrosion, the throughput (manufacturing efficiency) and service life of the CVD apparatus greatly increase.

Next, a method of keeping the state of a pre-coated film as much as possible without etching it in cleaning the CVD apparatus will be described. The following description also applies to cleaning other than cleaning with the HF gas.

As described above, when an $SiO_2$ film is formed on a semiconductor substrate or the like by plasma CVD in the process of manufacturing a semiconductor device, the plasma impacts on the inner chamber wall. To prevent a metal as a chamber material from mixing in the $SiO_2$ film upon etching, a $SiO_2$ film or the like is formed in advance as a pre-coated film on the inner chamber wall.

This pre-coated film is left after the cleaning step (ideally, the initial formation state of the pre-coated film is kept). That is, etching of the pre-coated film is prevented, and only a deposition film on the pre-coated film is selectively removed by utilizing the difference in quality between the pre-coated film and the deposition film formed on the pre-coated film upon forming the $SiO_2$ film.

More specifically, the quality of the pre-coated film is improved by heating the chamber itself in forming the pre-coated film. When the $SiO_2$ film is to be deposited on the semiconductor substrate, the chamber itself is not heated or is cooled. With this processing, the quality of the deposited $SiO_2$ film is degraded (to a degree not to impair the semiconductor device). In the subsequent cleaning step, the pre-coated film can be left, and only the $SiO_2$ film deposited thereon can be removed.

The use of a gas plasma containing a halogen such as F, or the use of the HF gas is effective in the cleaning step. When an SiOF film is to be deposited on the semiconductor substrate, the pre-coated film can be left, and only the SiOF film deposited thereon can be removed in the subsequent cleaning step even if the formation temperature of the $SiO_2$ film as a pre-coated film is not particularly controlled The above embodiment will be described below with reference to the several views of the accompanying drawing.

Figure 16:
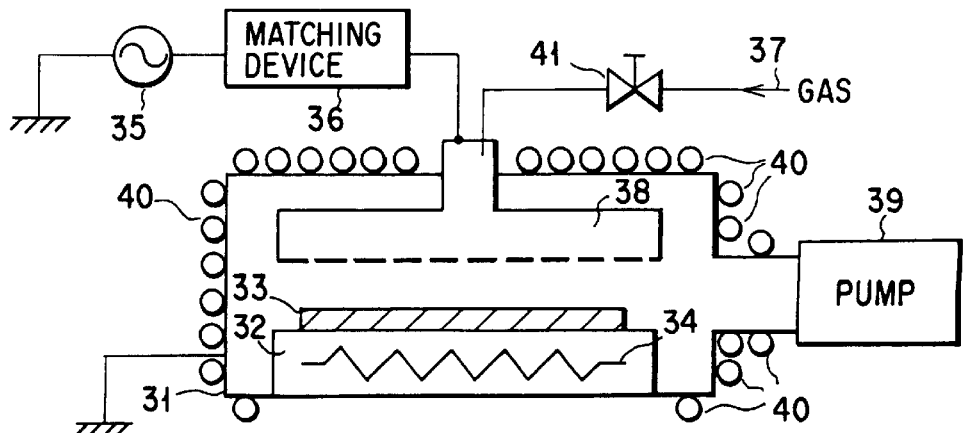
FIG. 16 is a conceptual view showing main part of the system arrangement of a plasma (CVD apparatus according to the 16th and 18th embodiments of the present invention.

FIG. 16 is a conceptual view showing main part of the system arrangement of a plasma CVD apparatus according to the 16th embodiment. Reference numeral 31 denotes a reaction chamber of the CVD apparatus; 32, a wafer holder and lower electrode (susceptor); 33, a semiconductor substrate; 34, a resistance heater; 35, an RF power supply; 36, a matching device; 37, a gas inlet; 38, a shower nozzle and upper electrode; 39, a vacuum pump; 40, a resistance heater; and 41, a gas supply valve.

Cleaning in the method of this embodiment assumes an indispensable condition that a pre-coated film (e.g., an $SiO_2$ film) is formed as a protection film in the interior of the chamber 31. In this embodiment, in forming the pre-coated film, the chamber 31 is heated to 100° C. or higher by the heater 40 set outside the chamber 31. At this time, a dummy semiconductor substrate or the like may be set on the wafer holder 32 so as to prevent deposition of the pre-coated film on the wafer holder 32.

In this state, $SiH_4$ and $O_2$ are respectively supplied at 50 $cm^3$/min and 500 $cm^3$/min from the gas inlet 37 to the shower nozzle 38 through the gas valve 41, while the internal chamber pressure is kept at 5 Torr. The upper electrode 38 with the shower nozzle serving as the counter electrode of the wafer holder 32 (lower electrode) is connected to the RF power supply 35 through the matching device 36. 13.56-MHz RF power of 1 kW is applied to the electrode 38 to start a discharge and form a pre-coated film. Thereafter, the chamber 31 is cooled using a water- or air-cooled cooling mechanism (not shown).

Then, the semiconductor substrate 33 used for an actual manufacturing process is placed on the wafer holder 32 in the chamber 31. The resistance heater 34 is arranged in the wafer holder 32 to heat it to 400° C. The gas inlet 37 is connected to the shower nozzle (upper electrode) 38 through the gas valve 41 so as to introduce TEOS and $SiH_4$ as source gases, $O_2$ and $N_2O$ as oxide gases, $NF_3$ and $CF_4$ as doping gases, and the like.

When an $SiO_2$ film is to be formed on the semiconductor substrate 33, e.g., TEOS as a source gas and $O_2$ are simultaneously introduced into the chamber 31 at flow rates of 50 $cm^3$/min and 500 $cm^3$/min, respectively, while the internal chamber pressure is kept at 5 Torr. 13.56-MHz RF power of 1 kW is applied to the electrode 38 facing the semiconductor substrate 33 to start a discharge and form a film. At this time, although the $SiO_2$ film is also deposited on the pre-coated film on the inner wall of the chamber 31. However, since the inner wall of the chamber 31 is not heated, the quality of the $SiO_2$ film is greatly poorer than that of the $SiO_2$ film serving as the pre-coated film formed in advance (details will be described later).

Deposition of the $SiO_2$ film on one or a plurality of semiconductor substrates hinders a film formation process which greatly influences peeling and the like of a film deposited on the inner wall of the chamber 31 (i.e., an unnecessary deposition film on the pre-coated film). Then, cleaning is performed.

The processing number of semiconductor substrates is properly determined depending on the thickness of a processing film and the inner shape of the chamber. In the cleaning step, the inner wall of the chamber 31 is first heated to 180° C. by the heater 40, and $CF_4$ is introduced into the chamber at 200 cm³/min. While the pressure is kept at 1 Torr, 13.56-MHz RF power of 100 W is applied to the electrode 38 to start a discharge. Since the discharge power is low in the chamber 31, the number of ions generated during the cleaning step is much smaller than that during the film formation step, but many neutral F excitons called radicals are generated. The F radicals reach the inner wall of the chamber 31. Since the chamber is heated to 180° C., water contained in the deposition film on the pre-coated film is eliminated, and the F radicals react with the water on the film surface to form HF. HF etches the $SiO_2$ film at a high speed. It has already been described in the 11th and 12th embodiments that a film containing a large amount of water is etched at a higher speed. After the pre-coated film is exposed, no degassed water exists, and HF is not generated to substantially stop etching. When cleaning was controlled (etching was stopped) by this method, a good cleaning state was obtained, and no problem arose except that a deposition film was slightly, partially left on a pre-coated film in a chamber 31 and its thickness varied.

As described above, when the pre-coated film is exposed, cleaning substantially stops because of the difference in quality between the pre-coated film and the deposition film on the pre-coated film. The pre-coated film is so formed as to positively increase the film density while heating the chamber 31 to 100° C. or higher. More preferably, a denser pre-coated film can be formed by heating the chamber 31 to 200° C. or higher. Compared to this pre-coated film, the deposition film formed on the pre-coated film during the manufacturing process is low in density, and contains a large amount of water. Further, a dense pre-coated film can be formed by a method of irradiating ultraviolet rays or a method of exposing the film to a plasma. In this case, although not shown, an ultraviolet irradiation mechanism must be arranged, or conditions for generating a plasma must be set after forming the pre-coated film. The density of the pre-coated film can be changed variously, e.g., only on its surface or as a whole.

FIGS. 17A and 17B are graphs of infrared absorption spectra, respectively, showing the inspection result of the difference in quality between a film (deposition film) deposited on a pre-coated film in forming an $SiO_2$ film on a semiconductor substrate, and the pre-coated film on the inner chamber wall on the basis of infrared absorption spectroscopy (FT-IR method). The ordinate represents the absorbance (log(IO/I); IO is incident light, and I is transmitted light), and the abscissa represents the reciprocal of the wavelength in $1/\lambda cm^{-1}$. As is apparent from this result, a very high absorbance was confirmed near 3,500 $cm^{-1}$ for the deposition film on the pre-coated film, and a large amount of water was contained in the deposition film. As a result of comparison between the film densities of the two films, the density of the pre-coated film was 2.15 $g/cm^3$, and that of the deposition film on the pre-coated film was 2.05 $g/cm^3$. At present, the difference between these film qualities is considered to be the cause of substantially stopping cleaning when the pre-coated film is exposed. That is, the difference between these film qualities realizes the step of leaving the pre-coated film in cleaning and selectively removing only the deposition film on the pre-coated film. This can be realized if the etching selectivity of the pre-coated film to the deposition film on the pre-coated film is about 1:2 as far as the thicknesses of these films are the same. Preferably, the selectivity is set to 1:3 or more. The above-described difference in quality between the pre-coated film and the deposition film thereon can be easily realized with a selectivity of 1:3 or more.

In the 16th embodiment, $SiH_4/O_2$ is used to form the pre-coated film. However, the gas is not limited to it, and a combination of a gas containing at least Si and an oxide gas may be used to form an $SiO_2$ film as a deposition film. In addition, $CF_4$ is used as a cleaning gas, but the gas is not limited to it. For example, a gas containing at least F such as $NF_3$, $C_2F_6$, or $SF_6$ may be used, and if $O_2$ is added to such a gas, the same effect as described above can be obtained.

The 17th embodiment will be described. A pre-coated film is formed on the inner chamber wall by the same procedure as in the 16th embodiment. Although the discharge of $CF_4$ gas is used for cleaning in the 16th embodiment, HF gas is used without any discharge in the 17th embodiment. The same effect as described above was obtained upon performing cleaning in this manner. Also in this case, it was confirmed that water eliminated from the film upon heating increased the film etching rate to selectively etch only the deposition film on the pre-coated film. In this embodiment, the same effect as described above was also obtained using $ClF_3$ gas instead of the HF gas.

Next, the 18th embodiment of the present invention will be described with reference to FIG. 16. This embodiment is related to a plasma CVD apparatus for an SiOF film. After a pre-coated film is formed on the inner wall of a chamber 31 by the same method as in the 16th embodiment, a semiconductor substrate 33 is set on a wafer holder 32. Subsequently, the semiconductor substrate 33 is heated to about 370° C. by a heater 34. TEOS as a source gas, $O_2$, and $NF_3$ are simultaneously introduced into the chamber 31 at flow rates of 50 cm³/min, 500 cm³/min, and 0 to 500 cm³/min, respectively, while the internal chamber pressure is kept at 5 Torr. 13.56-MHz RF power of 1 kW is applied to an electrode 38 facing the semiconductor substrate 33 to start a discharge and form an SiOF film.

Deposition of the SiOF film on one or a plurality of semiconductor substrates hinders a film formation process which greatly influences peeling and the like of a film deposited on the inner wall of the chamber 31 (i.e., an unnecessary deposition film on the pre-coated film). Then, cleaning is performed.

The processing number of semiconductor substrates is properly determined depending on the thickness of a processing film and the inner shape of the chamber. In the cleaning step, $H_2O$ is introduced into the chamber 31 at 200 cm³/min, and the internal pressure is kept at 5 Torr for 2 min. In this case, it was confirmed by an infrared absorbance method that water ($H_2O$) was selectively absorbed in the SiOF film deposited on the pre-coated film.

Then, the chamber side wall is first heated to 180° C. by the heater 40, and $CF_4$ is introduced into the chamber at 200 cm³/min. While the pressure is kept at 1 Torr, 13.56-MHz RF power of 100 W is applied to the electrode 38 to start a discharge. Since the discharge power is low in the chamber 31, the number of ions is smaller than that in film formation, but many neutral F excitons called radicals are generated. The F radicals reach the inner wall of the chamber 31. Since the chamber is heated to 180° C., water contained in the deposition film on the pre-coated film is eliminated, and the F radicals react with the water on the film surface to form HF. HF etches the $SiO_2$ film at a high rate and a film containing a large amount of water at a higher rate. After the pre-coated film is exposed, no degassed water exists, and HF is not generated to substantially stop etching. No problem arose though a deposition film was slightly, partially left on a pre-coated film in a chamber and its thickness varied.

In the 18th embodiment, the pre-coated film is formed with not only $SiH_4/O_2$ but also a combination of a gas containing at least Si and an oxidizable gas. In addition, $CF_4$ is used as a cleaning gas, but the gas is not limited to it. For example, a gas containing at least F such as $NF_3$, $C_2F_6$, or $SF_6$ may be used, and if $O_2$ is added to such a gas, the same effect as described above can be obtained.

In the above embodiment, the $SiO_2$ film is used as a pre-coated film, but an SiOF film may be used. Further, in the 18th embodiment, $H_2O$ is first introduced in the cleaning step. In some cases, however, a large amount of water is contained from the beginning in SiOF deposited on the pre-coated film depending on film formation conditions. In this case, no $H_2O$ is introduced.

The 19th embodiment will be described. A pre-coated film is formed on the inner chamber wall by the same procedure as in the 18th embodiment. Although the discharge of $CF_4$ gas is used for cleaning in the 18th embodiment, HF gas is used without any discharge in the 19th embodiment. The same effect as described above was obtained upon performing cleaning in this manner. Also in this case, it was confirmed that water eliminated from the film upon heating increased the film etching rate to selectively etch only the deposition film on the pre-coated film. In this embodiment, the same effect as described above was also obtained using $ClF_3$ gas instead of the HF gas.

According to the above embodiments, cleaning is reliably attained at a high speed without generating any particle and the like. At the same time, the above embodiments have exemplified various means for preventing corrosion and the like of respective portions in the chamber upon cleaning.

The embodiments have exemplified many examples using the parallel plate type capacitively coupled plasma CVD apparatus for an $SiO_2$ film, but a discharge method is not limited to them. A discharged may be induced by any one of an inductively coupled discharge method, a microwave discharge method, a magnetoron discharge method, a discharge method using electron beam bombardment, and a helicon discharge method, or a combination of a plurality of discharge methods.

In these embodiments, one type of frequency is used for the parallel plate type capacitively coupled apparatus. However, a plurality of frequencies may be superposed on each other, or a bias RF frequency may be simultaneously applied to the substrate.

In addition, the application to the plasma CVD apparatus has been described in each embodiment. The CVD apparatus is not limited to the plasma CVD apparatus, and the present invention can be applied to any CVD apparatus for an $SiO_2$ film such as a photo assisted CVD apparatus and a thermal CVD apparatus. Further, various changes and modifications can be deemed to lie within the spirit and scope of the invention.

As has been described above, according to the present invention, a film mainly consisting of Si and O, which is deposited on the inner chamber wall can be removed at a high speed by cleaning the CVD apparatus with HF gas. In addition, cleaning can be reliably attained without generating any particles and the like while preventing corrosion and the like of respective portions in the chamber. Further, various implements to selectively remove only a film deposited on a pre-coated film formed in advance on the inner wall of the chamber have been described in addition to cleaning with HF gas. The CVD apparatus which realizes a low manufacturing cost and a short processing time without generating any particle, and the cleaning method therefor can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cleaning method for a CVD apparatus for growing a fluorine-doped silicon oxide film, comprising:

step of introducing HF gas into said CVD apparatus after the HF gas is diluted with an inert gas, and etching and cleaning a film comprising Si, O, and F.

2. A cleaning method for a CVD apparatus for growing a silicon oxide film, comprising:

a step of introducing HF gas into the CVD apparatus to clean a deposit comprising Si and O, which attaches to an interior of said apparatus; and a step of selectively suppressing etching by partially heating the interior of said CVD apparatus.

3. A cleaning method for a CVD apparatus for growing a silicon oxide film, comprising:

introducing $H_2O$ gas into said CVD apparatus; and introducing HF gas into said CVD apparatus to clean a deposit comprising Si and O, which attaches to an interior of said apparatus, wherein the HF introduction is performed after the $H_2O$ introduction.

4. A cleaning method for a CVD apparatus for depositing an insulating film comprising silicon and oxygen on a semiconductor substrate, comprising:

a step of forming in advance a protection film which allows an etching selectivity with a deposit to be formed on said protection film afterward in said apparatus before loading said semiconductor substrate into said apparatus;

a step of forming said insulating film after loading said semiconductor substrate into said apparatus; and a step of cleaning an interior of said apparatus after unloading said semiconductor substrate, wherein the cleaning step includes a step of selectively removing only said deposit which attaches to said protection film in forming said insulating film.

5. A method according to claim 4, wherein said protection film is formed of the same elements as those of said insulating film comprising silicon and oxygen.

6. A method according to claim 4, wherein said protection film is formed to have a composition ratio representing a higher Si content than that in said deposit.

7. A method according to claim 4, wherein said protection film has a component from which hydrogen is substantially removed.

8. A method according to claim 4, wherein said protection film has a film density which is controlled to be higher than a film density of said deposit.

9. A method according to claim 4, further comprising a step of irradiating an ultraviolet ray after forming said protection film.

10. A method according to claim 4, further comprising the step of performing control so as to remove water from said protection film.

11. A cleaning method for a CVD apparatus for depositing an insulating film comprising silicon and oxygen on a semiconductor substrate, comprising:

a step of forming on an inner wall surface of said apparatus a protection film in advance which allows an etching selectivity with a deposit to be formed on said protection film afterward before loading said semiconductor substrate into said apparatus;

a step of forming said insulating film after loading said semiconductor substrate into said apparatus; and a step of cleaning an interior of said apparatus after unloading said semiconductor substrate, wherein said protection film is controlled such that a fluorine concentration of said deposit is higher than a fluorine concentration of said protection film, and the cleaning step has the step of selectively removing only said deposit which attaches to said protection film in forming said insulating film.

12. A method according to any one of claims 4, 6, 7, 8, 9, 10 and 11, wherein the cleaning step uses plasma processing.

13. A method according to any one of claims 4, 6, 7, 8, 9, 10 and 11, wherein the cleaning step comprises introducing HF gas.

* * * * *